United States Patent
Chung et al.

(10) Patent No.: US 6,275,069 B1
(45) Date of Patent: *Aug. 14, 2001

(54) SELF-RESETTING LOGIC CIRCUITS AND METHOD OF OPERATION THEREOF

(75) Inventors: Min-Chul Chung, Kyunggi-do; Chul-Min Jung, Seoul, both of (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/222,497

(22) Filed: Dec. 29, 1998

(30) Foreign Application Priority Data

Dec. 31, 1997 (KR) .................................. 97-81005

(51) Int. Cl.[7] .............................................. H03K 19/096
(52) U.S. Cl. ............................ 326/98; 396/29; 396/95; 327/175; 327/291
(58) Field of Search ..................... 326/95, 98, 29; 307/172, 175, 176, 291, 799

(56) References Cited

U.S. PATENT DOCUMENTS

| | | | |
|---|---|---|---|
| 4,591,744 | 5/1986 | Koike | 307/518 |
| 4,751,407 | 6/1988 | Powell | 307/480 |
| 5,220,217 | * 6/1993 | Scarra et al. | 307/481 |
| 5,291,076 | 3/1994 | Bridges et al. | 307/449 |
| 5,374,894 | 12/1994 | Fong | 327/14 |
| 5,430,399 | 7/1995 | Wendell | 326/121 |
| 5,465,060 | 11/1995 | Pelella | 327/51 |
| 5,467,037 | 11/1995 | Kumar et al. | 327/142 |
| 5,488,319 | 1/1996 | Lo | 326/115 |
| 5,543,735 | 8/1996 | Lo | 326/93 |
| 5,550,490 | 8/1996 | Durham et al. | 326/98 |
| 5,576,644 | 11/1996 | Pelella | 327/51 |
| 5,650,733 | 7/1997 | Covino | 326/245 |
| 5,986,475 | * 11/1999 | Kim et al. | 326/95 |

FOREIGN PATENT DOCUMENTS 2 092 850 A   8/1982  (GB) .
2 267 191 A  11/1993  (GB) .

OTHER PUBLICATIONS

European Search Report, EP 98 30 9421, Jan. 11, 2000, 4 pages.

* cited by examiner

*Primary Examiner*—Michael Tokar
*Assistant Examiner*—Anh Tran
(74) *Attorney, Agent, or Firm*—Myers Bigel Sibley & Sajovec

(57) ABSTRACT

A self-resetting circuit includes a logic circuit operative to transition an output signal from a first logic state to a second logic state responsive to a first logic state transition of an input signal, along with a bistable reset circuit coupled to the logic circuit and operative to be triggered by the transition of the output signal from the first logic state to the second logic state to reset the output signal to the first logic state within a first predetermined interval following the transition of the output signal from the first logic state to the second logic state, and to be armed by a second logic state transition of the input signal next succeeding the first logic state transition, wherein the reset circuit is armed within a second predetermined interval following the second transition that is less than the first predetermined interval. Related operating methods are also discussed.

20 Claims, 11 Drawing Sheets

SELF-RESETTING LOGIC CIRCUITS AND METHOD OF OPERATION THEREOF

FIELD OF THE INVENTION

The present invention relates logic circuits and methods of operation thereof, and more particularly, to self-resetting logic circuits and methods of operation thereof.

BACKGROUND OF THE INVENTION

Dynamic logic circuits typically perform logic operations using properties of capacitive storage nodes. Such logic circuits are commonly utilized in processor logic, and are now being utilized in memory circuits.

The operations of a typical dynamic logic circuit fall into two distinct phases: a precharge phase and an evaluation phase. A clock signal provides logic synchronization and also allows predefined charge states to be established in a precharge phase of the clock cycle. One or more outputs are produced during a predetermined evaluation portion of the clock cycle.

Dynamic logic circuits are often contracted from complementary metal oxide semiconductor (CMOS) field effect transistors, due to their low power dissipation. A logic cell commonly used in dynamic CMOS logic circuits includes a precharge device (usually a single PMOS transistor) with a clock input to which a periodic clock signal is applied, a logic circuit (usually an NMOS circuit) with one or more logic inputs for receiving input signals, and an evaluation device (usually a single NMOS transistor) with a clock input for receiving the clock signal. During a precharge phase, the clock signal is at a logic low state ("0"), such that an output is connected to a supply voltage ($V_{DD}$) through the PMOS precharge transistor and precharged to a logic high ("1") state. The evaluation phase occurs when the clock signal transitions to a logic high state, turning off the PMOS precharge transistor and turning on the NMOS evaluation transistor. Depending on the input signal value(s), the output either is discharged to a logic low state or remains at a logic high state.

Thus, as described above, a typical dynamic logic circuit is driven by a clock signal to synchronize and to effect the associated logical function implemented in the logic circuit. The clock signal also serves to precharge the logic circuit so that it is ready for the next series of signal inputs.

One problem with utilizing a clock signal to synchronize logical operations within an integrated circuit, which may include logic circuits cascaded as a plurality of stages, is that the clock signal may be subject to noise and clock skew while being transmitted throughout the integrated circuit, resulting in a distorted and inaccurate response at a given one of the cascaded logic circuits.

A proposed solution to the foregoing problem is to combine a reset circuit with a logic circuit, the reset circuit being operative to precharge the logic circuit to a ready state so that it can accept input signals and responsively perform logical operations in a coordinated fashion. Examples of such conventional self-resetting dynamic CMOS logic circuits are described in U.S. Pat. No. 4,751,407 to Powell, U.S. Pat. No. 5,465,060 to Pelella, U.S. Pat. No. 5,467,037 to Kumar et al., U.S. Pat. No. 5,543,735 to Lo, U.S. Pat. No. 5,550,490 to Durham et al., U.S. Pat. No. 5,576,644 to Pelella, and U.S. Pat. No. 5,650,733 Covino.

The output signal produced by such a self-resetting circuit may be directly affected by the input pulse width. When such self-resetting dynamic logic circuits are cascaded in a plurality of stages in an integrated circuit such as a processor or memory, there may be a need to provide a reset (or precharge) timing margin for each circuit in order to guarantee stable reset operation. Along a cascade of stages, the need to provide a reset margin may cause respective stage output pulse widths to undesirably increase down the chain of stages. For this and other reasons, it may be difficult to control the timing of the integrated circuit.

SUMMARY OF THE INVENTION

In light of the foregoing, it is an object of the present invention to provide self-resetting logic circuits and methods of operation thereof that exhibit improved timing control.

It is another object of the present invention to provide self-resetting logic circuits and methods of operation thereof suitable for high-speed applications.

It is yet another object of the present invention to provide self-resetting logic circuits and methods of operation thereof exhibiting stable operation.

These and other objects, features and advantages are provided according to the present invention by self-resetting logic circuits and methods of operation thereof in which a logic circuit is combined with a reset circuit that is triggered to reset an output signal produced by the logic circuit responsive to state transition of the output signal within a first predetermined interval, and which can be armed responsive to a state transition of an input signal to the logic circuit within a second predetermined interval that is substantially less than the first predetermined interval. The reset circuit preferably includes a bistable circuit that has a set input that is responsive to the output signal from the logic circuit and a reset input that is responsive to the input signal to the logic circuit, the bistable circuit producing an output signal that is coupled to a reset input node of the logic circuit that controls resetting of the logic circuit.

Self-resetting logic circuits and methods of operation thereof according to the present invention offer several advantages over conventional self-resetting circuits. Because the delay in rearming the reset circuit can be made much shorter than that involved in resetting the output of the logic circuit, self-resetting circuits according to the present invention can tolerate high-speed input signals, and do not require inordinately large reset timing margins. Accordingly, self-resetting logic circuits according to the present invention are well suited for cascaded high-speed logic operations in devices such as processors and memories.

In particular, according to the present invention, a self-resetting circuit includes a logic circuit operative to transition an output signal from a first logic state to a second logic state responsive to a first logic state transition of an input signal, along with a bistable reset circuit coupled to the logic circuit and operative to be triggered by the transition of the output signal from the first logic state to the second logic state to reset the output signal to the first logic state within a first predetermined interval following the transition of the output signal from the first logic state to the second logic state, and to be armed by a second logic state transition of the input signal next succeeding the first logic state transition, wherein the reset circuit is armed within a second predetermined interval following the second transition that is substantially less than the first predetermined interval.

According to embodiments of the present invention, the logic circuit has an input node configured to receive the input signal, and a reset input node and an output node, and is operative to produce a transition in the output signal at the output node responsive to the input signal when the reset input node is at a first one of the first and second logic states and to reset the output signal to the first logic state when the reset input is at a second one of the first and second logic states. The bistable reset circuit has a first input node coupled to the output node of the logic circuit, a second input node coupled to the input node of the logic circuit, and an output node coupled to the reset input node of the logic circuit, and is operative to set the reset input node of the logic circuit to the first one of the first and second logic states responsive to the input signal and to set the reset input node of the logic circuit to the second one of the first and second logic states responsive to the output signal.

In another embodiment according to the present invention, a self-resetting circuit includes a logic circuit having an output node, an input node and a reset input node and operative to transition an output signal at the output node from a first logic state to a second logic state responsive to a first logic state transition of an input signal at the input node when the reset input node is at a first one of a first logic state and a second logic state and to reset the output signal to the first logic state when the reset input is at a second one of the first and second logic states. A reset circuit is operatively associated with the logic circuit and includes a bistable circuit having a set input node coupled to the output node of the logic circuit via a delay circuit, a reset input node coupled to the input node of the logic circuit, and an output node coupled to the reset input node of the logic circuit. The bistable circuit preferably is operative to set the reset input node of the logic circuit to the second one of the first and second logic states within a first interval following a transition of the output signal to the second logic state, and to reset the reset input node to the first one of the first and second logic states within a second interval following a second logic state transition of the input signal that immediately succeeds the first logic state transition, the second interval less than the first interval.

In another embodiment according to the present invention, a self-resetting circuit includes a logic circuit having an output node, an input node and a reset input node and operative to transition an output signal at the output node from a first logic state to a second logic state responsive to a first logic state transition of an input signal at the input node when the reset input node is at a first one of a first logic state and a second logic state and to reset the output signal to the first logic state when the reset input is at a second one of the first and second logic states. A reset circuit is operatively associated with the logic circuit and includes a bistable circuit having a set input node coupled to the output node of the logic circuit, a reset input node coupled to the input node of the logic circuit, and an output node coupled to the reset input node of the logic circuit via a delay circuit. The bistable circuit preferably is operative to set the reset input node of the logic circuit to the second one of the first and second logic states within a first interval following a transition of the output signal to the second logic state, and to reset the output node of the logic circuit to the first logic state within a second interval following a second logic state transition of the input signal that immediately succeeds the first logic state transition, the second interval less than the first interval.

According to method aspects of the present invention, a logic circuit is operated by transitioning an output signal of the logic circuit from a first logic state to a second logic state responsive to a first logic state transition of an input signal to the logic circuit. A reset circuit coupled to the logic circuit is triggered responsive to the transition of the output signal from the first logic state to the second logic state to reset the output signal of the logic circuit to the first logic state within a first predetermined interval following the transition of the output signal from the first logic state to the second logic state. The reset circuit is armed responsive to a second logic state transition of the output signal next succeeding the first logic state transition within a second predetermined interval following the second logic state transition that is substantially less than the first predetermined interval. Improved self-resetting of the logic circuit may thereby be provided.

DETAILED DESCRIPTION OF EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As will be appreciated by one of skill in the art, the present invention may be embodied as methods or devices.

Figure 1:
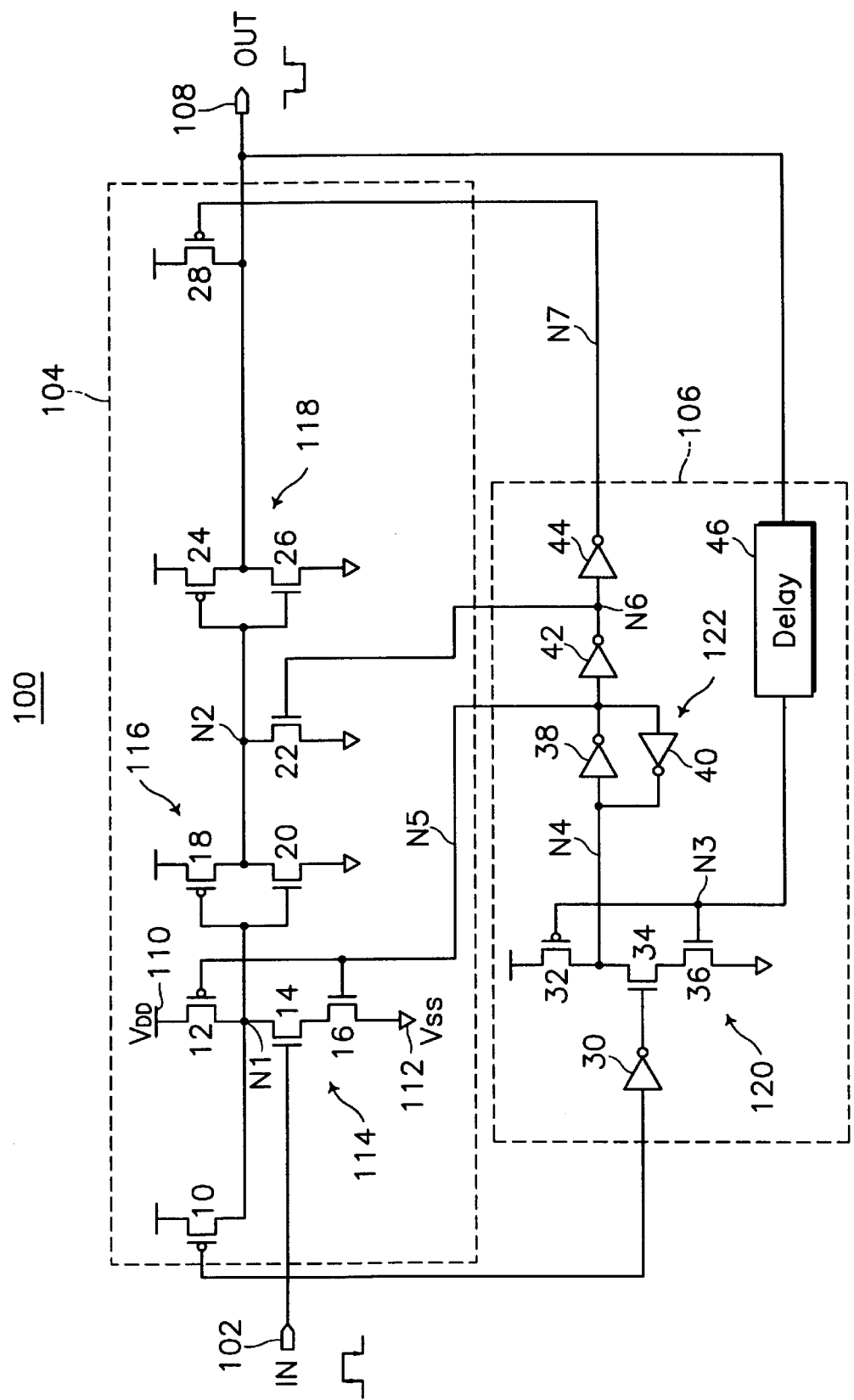
FIG. 1 illustrates a self-resetting dynamic logic circuit.

FIG. 1 illustrates a self-resetting dynamic CMOS logic circuit 100 similar to the conventional logic circuits described above, and in particular, an inverter. The self-resetting inverter circuit 100 includes a logic input node 102 for receiving an input signal IN, an inverter logic circuit 104 for performing a logical inversion operation with respect to the input signal IN, a reset circuit 106 for resetting the inverter logic circuit 104, and a logic output node 108 for providing an output signal OUT.

The inverter logic circuit 104 includes a PMOS transistor 10 of a smaller size than typical transistors of the circuit 104 and a dynamic inverter 114 including one PMOS transistor 12 and two NMOS transistors 14, 16. The conduction path (i.e., channel) of the PMOS transistor 10 is coupled between a first voltage bus 110 (i.e., a bus at a power supply voltage $V_{DD}$) and a node N1. The input signal IN is applied to the gates of the transistors 10, 14 via the input node 102. The PMOS transistor 12 has its conduction path coupled between the first voltage bus 110 and the node N1. The conduction paths of NMOS transistors 14, 15 are connected in series between the node N1 and a second voltage bus 112 (i.e., a bus at a signal ground voltage $V_{SS}$). A CMOS static inverter 116, including a PMOS transistor 18 and a smaller NMOS transistor 20, and another inverter 118 including a smaller PMOS transistor 24 and a larger NMOS transistor 26, are connected in series between the node N1 and the logic output node 108. A larger NMOS transistor 22 has its conduction path coupled between the second voltage bus 112 and the junction node N2 of the inverters 116, 118. A larger PMOS transistor 28 is provided between the inverter 118 and the logic output node 108 and has its conduction path coupled between the voltage bus 110 and the logic output node 108.

An inverter 30 and a dynamic inverter 120, including one PMOS transistor 32 and two NMOS transistors 34, 36, are included in the reset circuit 106. Conduction paths of the transistors 32, 34, 36 are connected in series between the supply voltage node 110 and the ground voltage node 112. The input signal IN is also fed via the inverter 30 to the gate of the NMOS transistor 34. An inverting latch 122 including cross-coupled inverters 38, 40 is provided between the drain junction node N3 of transistors 32, 34 and a node N4 coupled to the gates of the transistors 12, 16. In addition, two inverters 42, 44 are included in the reset circuit 106. The inverter 42 has its input coupled to the node N5 and its output coupled a node N6 that is also coupled to the gate of NMOS transistor 22. The inverter 44 has its input coupled to the node N6 and its output coupled to the gate of PMOS transistor 28 at a node N7. The output signal OUT is fed back to the reset circuit 106 via a delay circuit 46 to a node N3 coupled to gates of the transistors 32, 36.

In an armed (or ready) state, when input signal IN is at a logic low state, node N1 is charged by the PMOS transistor 10 to a logic high state, so that the output signal OUT at node 108 is maintained high by the inverters 116, 118. With the input signal IN low and the output signal OUT high, the NMOS transistors 34, 36 in the reset circuit 106 are conductive, causing the nodes N4, N6 to be pulled down to a logic low state, i.e., to a voltage level near the signal ground voltage $V_{SS}$, and nodes N5, N7 to be pulled up to a logic high state, i.e., to a voltage level near the supply voltage $V_{DD}$. The NMOS transistor 16 in the inverter logic circuit 104 thus becomes conductive and renders the logic circuit 104 ready for the next logical operation.

When the input signal IN transitions from a logic low state to a logic high state, node N1 is discharged to a logic low state, as the NMOS transistors 14, 16 both become conductive. This causes the output signal OUT to change from a logic high state to a logic low state. This state transition of the output signal OUT is fed back to node N3 via the delay circuit 46, causing the node N4 to go high due to the conduction through the PMOS transistor 32. The logic high state on node N4 also causes nodes N5, N7 to go low and node N6 to go high. Owing to the logic low state at nodes N5, N7 and the logic high state at node N6, the transistors 12, 22, 28 are turned on and the transistor 16 is turned off. Thus, the output signal OUT is reset, that is, the node N1 and the logic output node 108 are charged high again.

The low-to-high transition of the output signal OUT on the node 108 is also sent to node N3 via the delay circuit 46, so that PMOS transistor 32 is turned off and the NMOS transistor 36 is turned on. Because NMOS transistor 34 remains off due to the action of the latch 122, nodes N5, N6,N7 remain unchanged, i.e., nodes N5, N7 remain low and node N6 remains high, while the input signal IN is maintained high. However, if the input signal IN transitions to a low state again, then node N4 goes low as the NMOS transistors 34, 36 are rendered conductive, and nodes N5, N7 are driven high and node N6 is driven low. This turns on the NMOS transistor 16 and turns off the PMOS transistor 28 so that the inverter logic circuit 104 is ready for a subsequent transition of the input of signal IN.

Figure 2A:
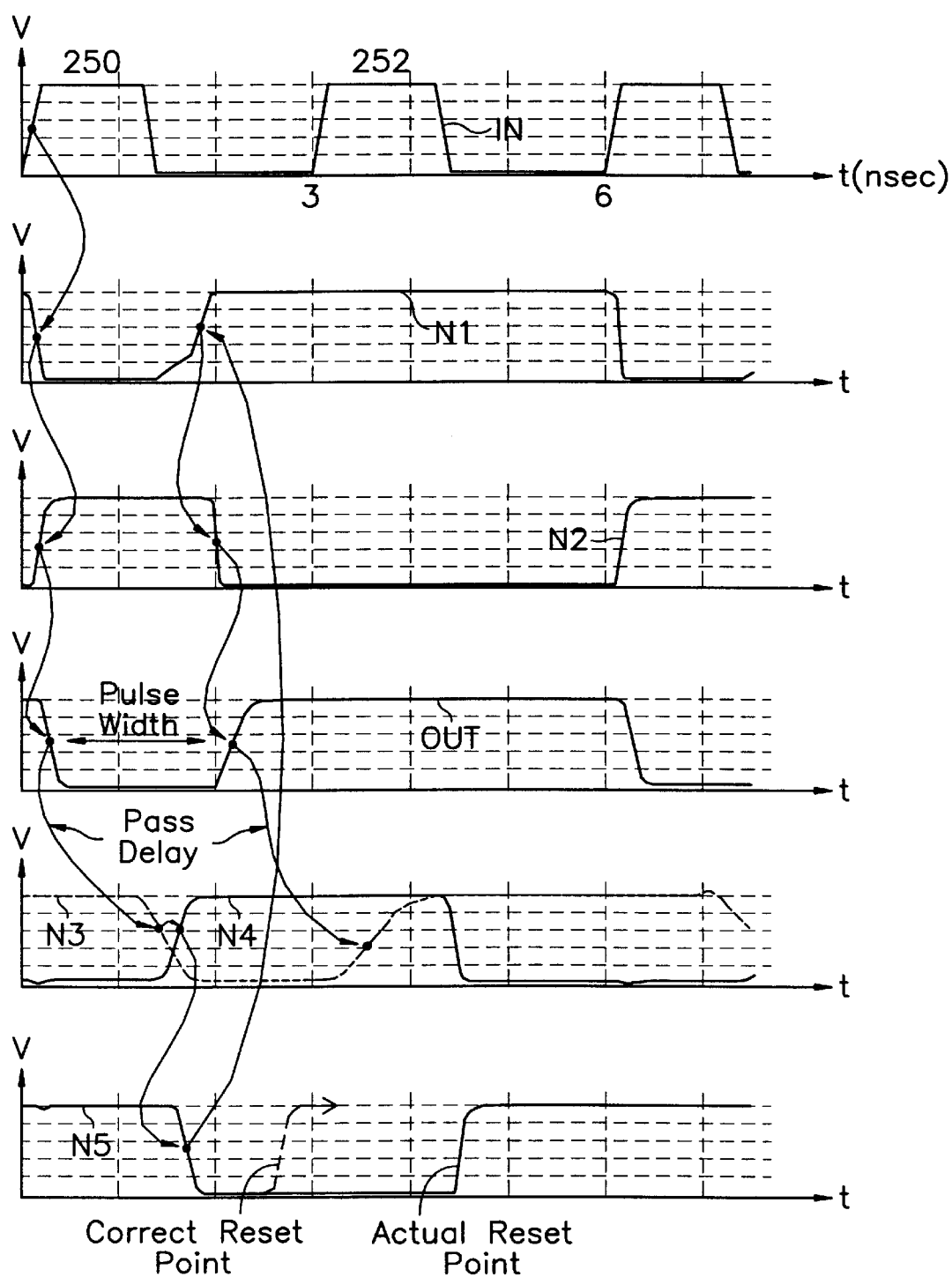
FIGS. 2A and 2B are timing diagrams illustrating exemplary operational errors exhibited by the circuit of FIG. 1.
Figure 2B:
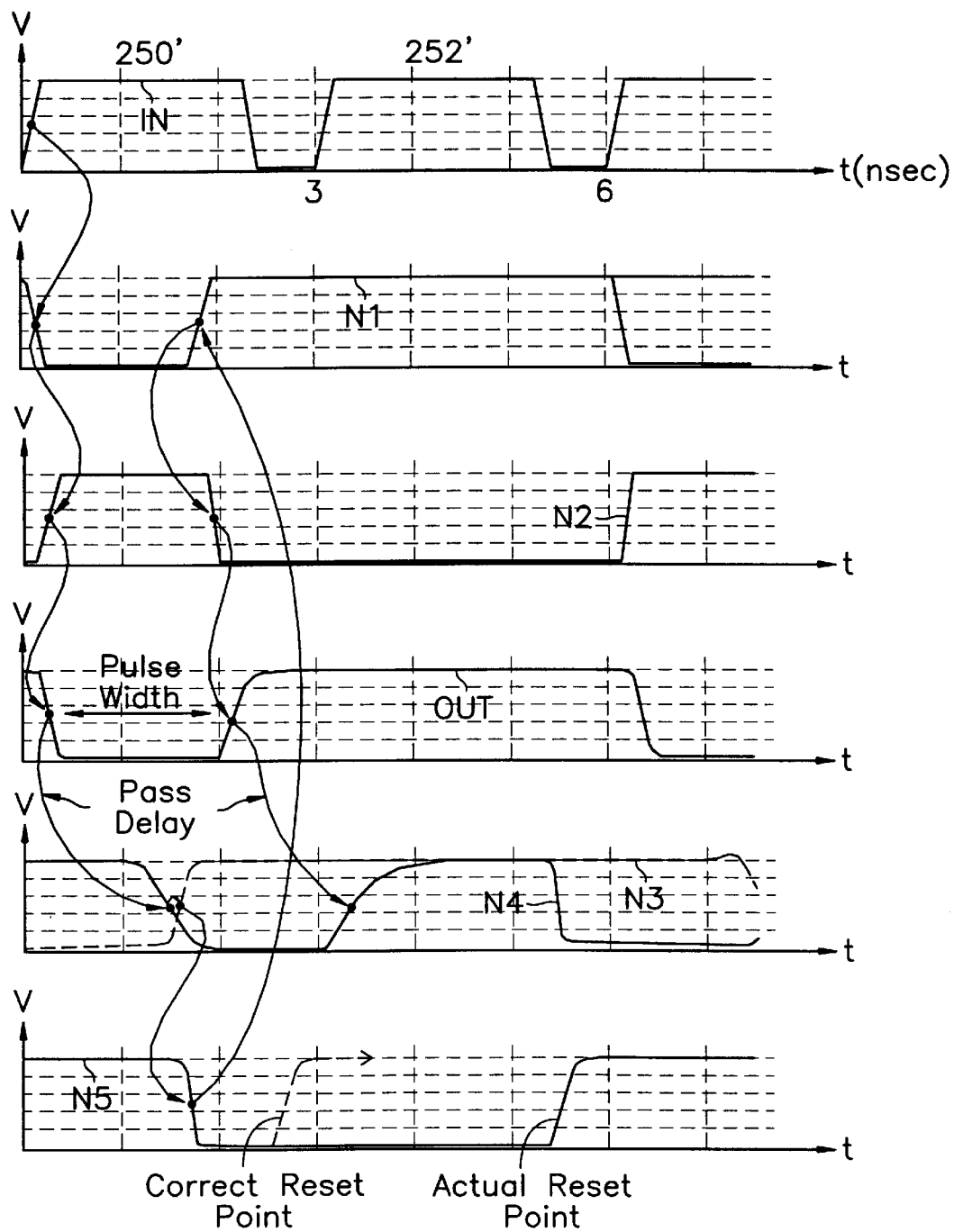

In the above-described circuit, if the reset time of the inverter logic circuit 104 varies from nominal design due to process or environmental variations that affect the delay introduced by the delay circuit 46, operational errors may occur as shown in FIGS. 2A–2B. As can be seen in FIGS. 2A and 2B, although after a first input signal pulse 250, 250', the inverter logic circuit 104 must be reset by the reset circuit 106 in order for the inverter logic circuit to properly respond to a second input signal pulse 252, 252'. If the node N5 is still low when the second input signal pulse 252, 252' occurs, the inverter logic circuit 104 does not properly respond to the second input signal pulse 252, 252', such that the output signal OUT erroneously remains high. Accordingly, because of it may exhibit a relatively long feedback delay time, the above-described circuit may be unsuitable for high speed and high performance applications.

Figure 3:
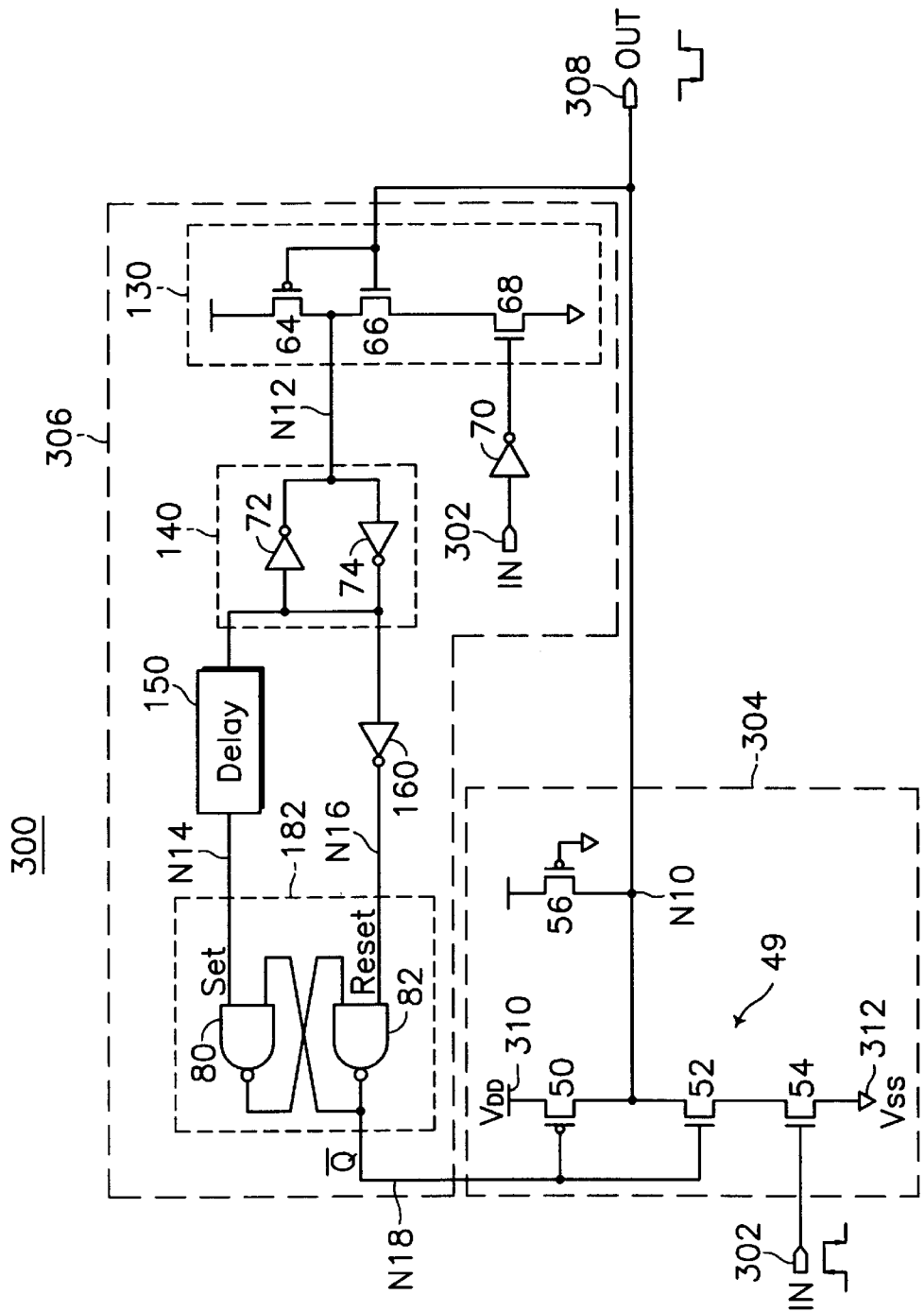
FIG. 3 is a schematic diagram illustrating a self-resetting logic circuit according to a first embodiment of the present invention.

Reference is now made to FIG. 3, which illustrates a self-resetting logic circuit 300 according to a first embodiment of the present invention. The self-resetting logic circuit 300 includes an input node 302 for receiving an input signal IN, a logic circuit 304, in particular, an inverter that produces an inverted output signal OUT at an output node 308 from the input signal IN, and a reset circuit 306 that resets the logic circuit 304.

The logic circuit 304 includes a dynamic inverter 49 that includes a PMOS transistor 50, NMOS transistors 52, 54, and a PMOS transistor 56 of a smaller size than the other transistors. The transistors 50, 52, 54 have their conduction paths (i.e., channels) coupled in series between a first voltage bus 310, e.g., a bus at a supply voltage $V_{DD}$, and a second voltage bus 312, e.g., a bus maintained at a signal ground $V_{SS}$. Gates of the transistors 50, 52 are coupled together, while the transistor 54 receives the input signal IN at its gate. Transistor 56 has a conduction path coupled between the first voltage bus 310 and a drain junction node N10 of transistors 50, 52, i.e., at the output node 308, and a gate coupled to the second voltage bus 312.

The reset circuit 306 includes two static CMOS inverters 70, 160, a dynamic inverter circuit 130 including a PMOS transistor 64 and NMOS transistors 66, 68, an inverting latch 140 including two cross-coupled inverters 72, 74, a delay circuit 150 including, for example, a series of inverters (not shown), and a bistable circuit, e.g., a set-reset (S-R) flip-flop 182 including cross-coupled NAND gates 80, 82. Conduction paths of the transistors 64, 66, 68 are coupled in series between the first and second voltage busses 310, 312. The gates of the transistors 64, 66 are coupled to the output node 308. The input signal IN is supplied through inverter 70 to the gate of the transistor 68. One node of the inverting latch 140 is coupled to the transistors 64, 66 at a drain junction node N12, and another other node of the inverting latch 140 is coupled to the delay circuit 150 and the inverter 160. One input of the NAND gate 80, i.e., the set input Set of the flip-flop 182, is coupled to the delay circuit 150, and the other input of the NAND gate 80 is coupled to the output of the NAND gate 82. The NAND gate 82 has one input coupled to the output of NAND logic gate 80 and another input, i.e., the reset input Reset of the flip-flop 182, coupled to the inverter 160. An output $\overline{Q}$ of the logic gate 82 of the flip-flop 182 is coupled to a reset input node N18 to the gates of the transistors 50, 52 of the logic circuit 304.

When the input signal IN is at a logic low state, the NMOS transistor 54 is turned off and node N10 is charged by the PMOS transistor 56 such that the output signal OUT is at a logic high state. With the output signal OUT high, the node N12 goes low, as the NMOS transistors 66, 68 are turned on, causing the nodes N14, N16 to go high and low, respectively. The output $\overline{Q}$ of the flip-flop 182 thus goes high at node N18, and NMOS transistor 52 is in a conductive state, arming the logic circuit 300 to respond to the next transition of the input signal IN.

When the input signal IN transitions from a logic low state to a logic high state, node N10 is discharged to a logic low state as NMOS transistor 54 is put into a conductive state. In response, the output signal OUT changes from a logic high state to a logic low state, as the NMOS transistors 52, 54 become more conductive than the PMOS transistor 56.

The high-to-low transition of the output signal OUT triggers the reset circuit 306, causing the PMOS transistor 64 to conduct and the NMOS transistors 66, 68 to become non-conductive. This causes the node N12 to go high, which in turn causes node N16, i.e., the reset input Reset of the flip-flop 182, to go high. After an elapse of a predetermined delay, e.g., 0.5 to 1.5 nsec, introduced by the delay circuit 150, node N14, i.e., the set input Set of the flip-flop 182, goes low. This causes the flip-flop output $\overline{Q}$ at node N18 to go low, turning the NMOS transistor 52 off and the PMOS transistor 50 on. In response, the output signal OUT is driven back to a high logic state, i.e., the output signal OUT of the logic circuit 304 is reset by the reset circuit 306 within a time interval determined by the length of the delay introduced by the delay circuit 150. Consequently, adjusting the delay time of the delay circuit 150 can control the pulse width of the output signal OUT.

The low-to-high transition of the output signal OUT is fed back to the reset circuit 306, causing the PMOS 64 to turn off and the NMOS transistors 68 to turn on. If at this time the input signal IN has transitioned back to a low logic state, nodes N12, N16 go low and the flip-flop output signal $\overline{Q}$ at node N18 goes high. This turns off the PMOS transistor 50 and turns on the NMOS transistor 52, rendering the self-resetting logic circuit 300 armed to respond to the next state transition (low-to-high) of the input signal IN. If the input signal IN returns low well before the end of the delay introduced by the delay circuit 150, the output signal OUT is taken back to a high logic state, causing the flip-flop output $\overline{Q}$ to go to a high state, and rendering the self-resetting logic circuit 300 armed to respond to the next low-to-high state transition of the input signal IN. If the input signal IN remains high throughout the negative pulse in the output signal OUT and is still high after the output signal OUT has transitioned back to the high logic state, nodes N12, N16 remain high and node N18 remains low. When the input signal IN goes low again, the flip-flop output $\overline{Q}$ is quickly reset, rendering the self-resetting logic circuit 300 ready for the next low-to-high state transition of the input signal IN. Thus, it may be seen that the self-resetting logic circuit 300 may be quickly armed independent of the delay introduced by the delay circuit 150, with a delay that can be substantially less than the delay introduced by the delay circuit 150.

As described above, the high-to-low transition of the output signal OUT is transferred to the set input Set of the flip-flop 182 via delay circuit 150, thus producing a desired pulse width in the output signal OUT. However, the low state of the input signal IN can be directly fed back to the reset input Reset of the flip-flop 182 with considerably less delay in order to quickly prepare for the next operational cycle of the self-resetting logic circuit 300. This allows the self-resetting logic circuit 300 to be less vulnerable to process and/or environment variations that may affect the delay introduced by the delay circuit 150, resulting in more stable operation and reducing the likelihood of operational errors in high speed applications.

Figure 4:
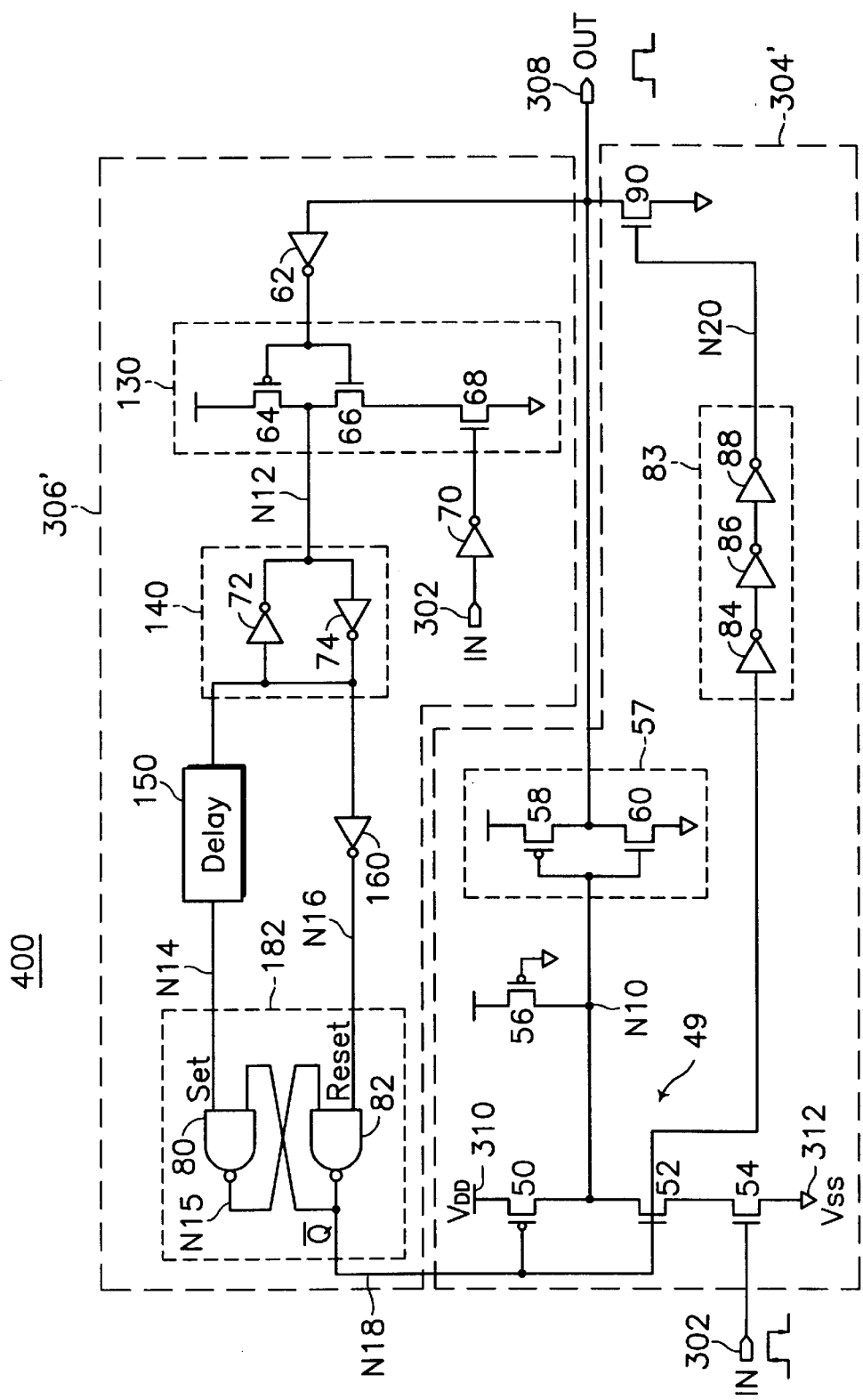
FIG. 4 is a schematic diagram illustrating a self-resetting logic circuit according to a second embodiment the present invention.

FIG. 4 illustrates a self-resetting logic circuit 400 according to a second embodiment of the present invention. The self-resetting logic circuit 400 includes a non-inverting buffer logic circuit 304'. The logic circuit 304' has a configuration similar to that of the logic circuit 304 of FIG. 3, with like reference numerals denoting like components. However, the logic circuit 304' additionally includes a static CMOS inverter 57, a delay circuit 83 and an NMOS transistor 90. The reset circuit 306' is similar to the reset circuit 306 of FIG. 3, with like reference numerals denoting like components, except for the addition of a static inverter 62 between the output node 308 of the logic circuit 304' and the dynamic inverter circuit 130.

In the logic circuit 304', the inverter 57 includes a PMOS transistor 58 and a maller NMOS transistor 60, and has an input coupled to a node N10 and an output coupled to the output node 308. The inverter 62 of the reset circuit 306' has an input coupled to the output node 308 and an output coupled to the input of the inverter 130. A delay circuit 83 included in the logic circuit 304' includes three serially-connected static inverters 84, 86, 88 coupled between node N18 (i.e., the output of the flip-flop 182) and the gate of a transistor 90 having a conduction path coupled between the output node 308 and the second voltage bus 312.

Figure 5:
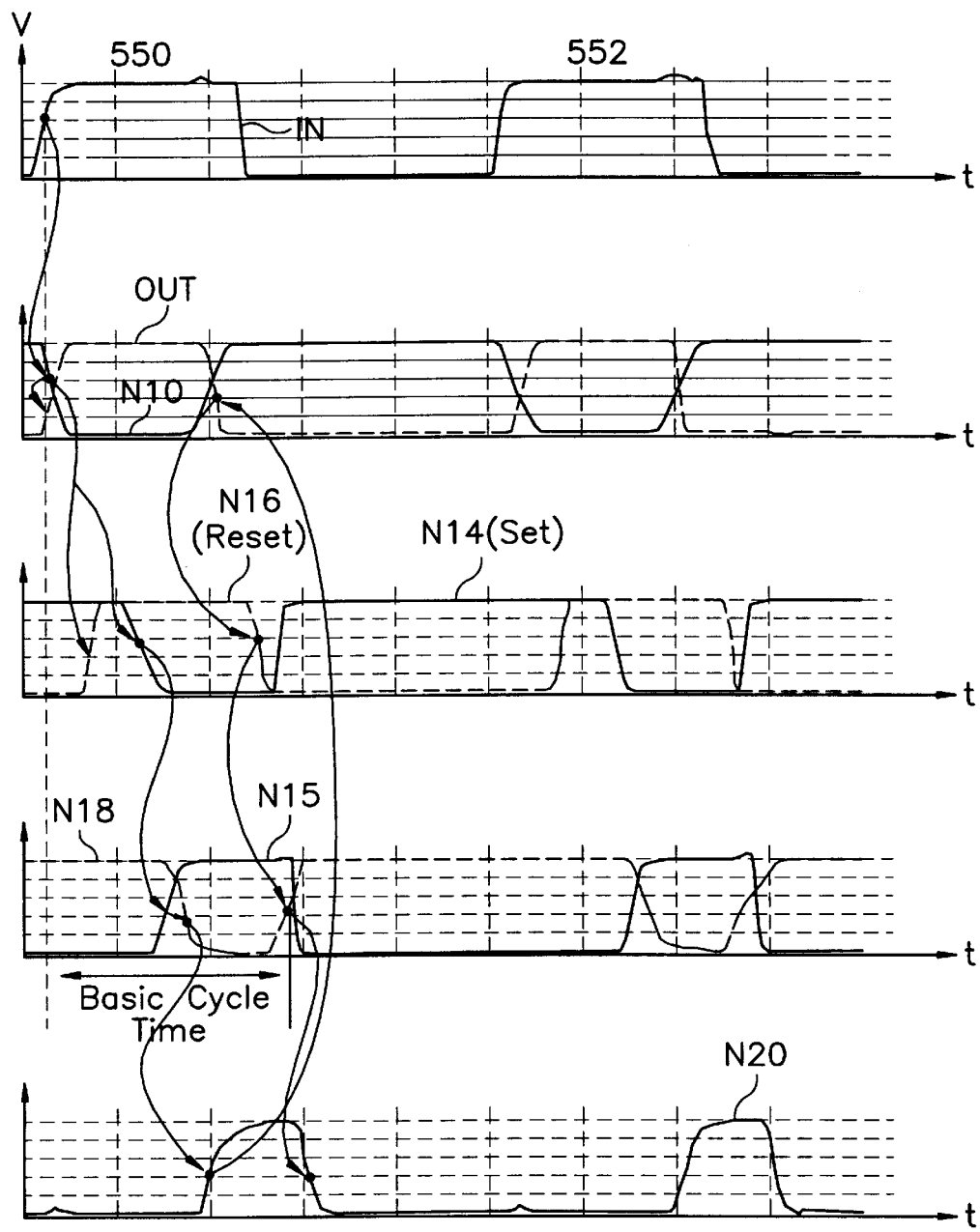
FIG. 5 is a timing diagram illustrating exemplary operations of the logic circuit of FIG. 4.

Exemplary operations of the self-resetting logic circuit 400 of FIG. 4 will now be described with reference to FIG. 5. When the input signal IN is at a logic low state, node N10 is charged to a logic high state and output node 308 is held low. Accordingly, node N12 is at a logic low state, and nodes N14, N16 are high and low, respectively. The output $\overline{Q}$ of the flip-flop 182 is thus held high at node N18, the NMOS transistor 52 is conductive and the NMOS transistor 90 is turned off.

When the input signal IN transitions from a logic low state to a logic high state at the start of a pulse 550, 552 and the NMOS transistor 52 is conducting, node N10 is discharged to a logic low state because NMOS transistor 54 also conducts. The output signal OUT therefore changes from a logic low state to a logic high state. The low-to-high transition of the output signal OUT triggers the reset circuit 306', causing the PMOS transistor 64 to conduct and the NMOS transistors 66, 68 to be turned off. This drives node N12 high, and responsively thereto, node N16, i.e., the reset input Reset of the flip-flop 182, goes high. The output $\overline{Q}$ of the flip-flop 182 does not change initially, but after a predetermined delay, e.g., 0.5 to 1.5 nsec, introduced by the delay circuit 150, node N14 goes low. This sets the output $\overline{Q}$ of the flip-flop 182 to a low state at node N18, turning on the PMOS transistor 50, turning off the NMOS transistor 52, recharging the node N10 to a high state, and resetting the output signal OUT back to a low state. The output signal OUT is thus reset by the reset circuit 306'.

The high-to-low transition of the output signal OUT is fed back to the reset circuit 306', causing the PMOS transistor 64 to turn off and the NMOS transistor 68 to turn on. At this time, if the input signal IN has already gone low, then nodes N12,. N16 go low and node N18 goes high, switching the PMOS and NMOS transistors 50, 52 off and on, respectively, so that the self-resetting logic circuit 400 is ready for the next low-to-high transition of the input signal IN. If the input signal IN goes low before the output $\overline{Q}$ of the flip-flop 182 goes low, the output signal OUT goes low, which in turn resets the output $\overline{Q}$ of the flip-flop 182 high. If the input signal IN remains high throughout the positive pulse of the output signal OUT and remains high after the output signal OUT goes low again, the transistor 68 is nonconductive, leaving nodes N12, N16 high, and leaving the output $\overline{Q}$ of the flip-flop 182 low. When the input signal IN finally goes low, the transistor 68 conducts, causing the nodes 12, 16 to go low and quickly reset the output $\overline{Q}$ of the flip-flop 182 to a logic high state, rendering the self-resetting logic circuit 400 armed for the next low-to-high transition of the input signal IN.

Similar to the self-resetting logic circuit 300 of FIG. 3, the low-to-high transition of the output signal OUT of the self-resetting logic circuit 400 is transferred to the set input Set of the flip-flop 182 via delay circuit 150, thus producing a desired pulse width in the output signal OUT. However, the low state of the input signal IN can be directly fed back to the reset input Reset of the flip-flop 182 with considerably less delay in order to quickly prepare for the next operational cycle of the self-resetting logic circuit 400. This allows the self-resetting logic circuit 400 to be less vulnerable to process and/or environment variations that may affect the delay introduced by the delay circuit 150, resulting in more stable operation and reducing the likelihood of operational errors in high speed applications.

Figure 6:
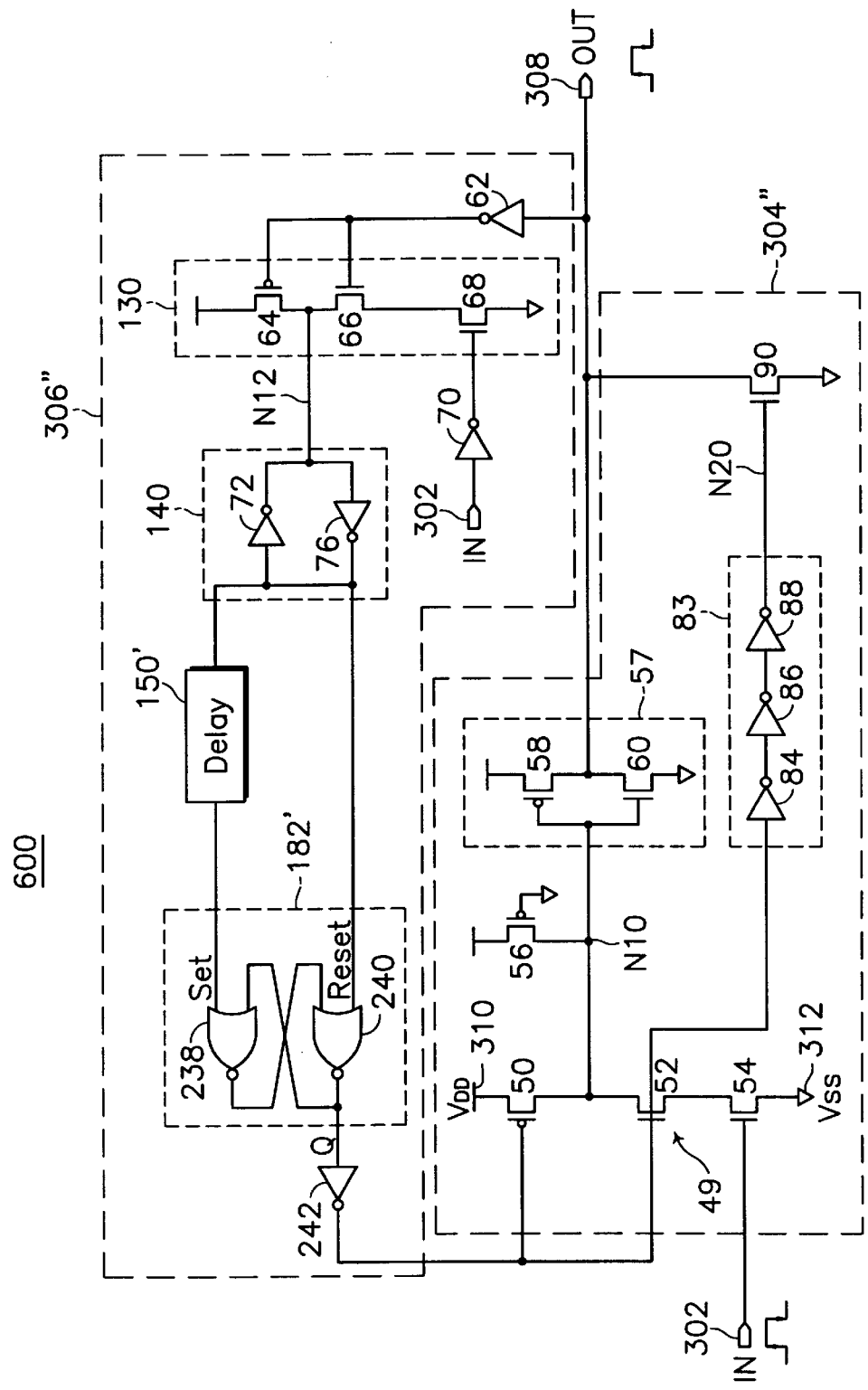
FIG. 6 is a schematic diagram illustrating a self-resetting logic circuit according to a third embodiment the present invention.

FIG. 6 illustrates a self-resetting logic circuit 600 according to a third embodiment of the present invention. The self-resetting logic circuit 600 includes a non-inverting buffer logic circuit 304" which has a similar configuration to that of the buffer logic circuit 304' of FIG. 4, with like reference numerals denoting like components. However, the inverter 160, cross-coupled NAND gates 80, 82 and the delay circuit 150 found in the logic circuit 304' of FIG. 4 are respectively replaced in the logic circuit 304" by a static inverter 242, a bistable circuit, e.g., a S-R flip-flop 182' including cross-coupled NOR gates 238, 240, and an inverting delay circuit 150' that includes, for example, an odd number of serially-connected inverters (not shown). The flip-flop 182' has a set input Set coupled to the delay circuit 150' and a reset input Reset coupled to the latch 140. An input of the inverter 242 is coupled to an output Q of the flip-flop 182' (i.e., the output of the NOR gate 240) and an output of the inverter 242 is coupled to the gates of transistors 50, 52 and to the delay circuit 83.

Exemplary operations of the self-resetting logic circuit 600 of FIG. 6 will now be described. When the input signal IN is at a logic low state, node N10 is charged to a logic high state and output node 308 is held low. Accordingly, node N12 is at a logic low state, the set input Set of the flip-flop 182' is held low, and the reset input Reset of the flip-flop 182' is held high. The output Q of the flip-flop 182' is thus held low, the NMOS transistor 52 is turned on and the NMOS transistor 90 is turned off due to a low state at the node N20.

When the input signal IN transitions from a logic low state to a logic high state, node N10 is discharged to a logic low state, causing the output signal OUT to change from a logic low state to a logic high state. The low-to-high transition of the output signal OUT triggers the reset circuit 306", causing the PMOS transistor 64 to conduct while the NMOS transistors 66, 68 are turned off. This drives node N12 high, and responsively thereto, the reset input Reset of the flip-flop 182' goes low. The output Q of the flip-flop 182' does not change initially, but after a predetermined delay, e.g., 0.5 to 1.5 nsec, introduced by the inverting delay circuit 150', the set input Set of the flip-flop 182' goes high, setting the output Q of the flip-flop 182' to a high state. This turns on the PMOS transistor 50 and turns off the NMOS transistor 52, recharges the node N10 to a high state, and resets the output signal OUT back to a low state. The output signal OUT is thus reset by the reset circuit 306".

The high-to-low transition of the output signal OUT is fed back to the reset circuit 306", causing the PMOS transistor 64 to turn off and the NMOS transistor 66 to turn on. At this time, if the input signal IN has already gone low, then node N12 goes low and the reset input Reset of the flip-flop goes high, resetting the flip-flop output Q to a low state. This switches the PMOS and NMOS transistors 50, 52 off and on, respectively, so that the self-resetting logic circuit 600 is ready for the next low-to-high transition of the input signal IN. If the input signal IN goes low before the output Q of the flip-flop 182' goes high, the output signal OUT goes low, which in turn resets the output Q of the flip-flop 182' low. If the input signal IN remains high throughout the positive pulse of the output signal OUT and remains high after the output signal OUT goes low again, the transistor 68 is nonconductive, leaving node N12 high and the output Q of the flip-flop 182' high. When the input signal IN finally goes low, the transistor 68 conducts, causing the node 12 to go low and quickly reset the output Q of the flip-flop 182' to a logic low, rendering the self-resetting logic circuit 400 armed for the next low-to-high transition of the input signal IN.

Similar to the self-resetting logic circuit 300 of FIG. 3 and the self-resetting logic circuit 400 of FIG. 4, the low-to-high transition of the output signal OUT of the self-resetting logic circuit 600 is transferred to the set input Set of the flip-flop 182' via delay circuit 150', thus producing a desired pulse width in the output signal OUT. However, the low state of the input signal IN can be directly fed back to the reset input Reset of the flip-flop 182' with considerably less delay in order to quickly prepare for the next operational cycle of the self-resetting logic circuit 600. This allows the self-resetting logic circuit 600 to be less vulnerable to process and/or environment variations that may affect the delay introduced by the delay circuit 150', resulting in more stable operation and reducing the likelihood of operational errors in high speed applications.

Figure 7:
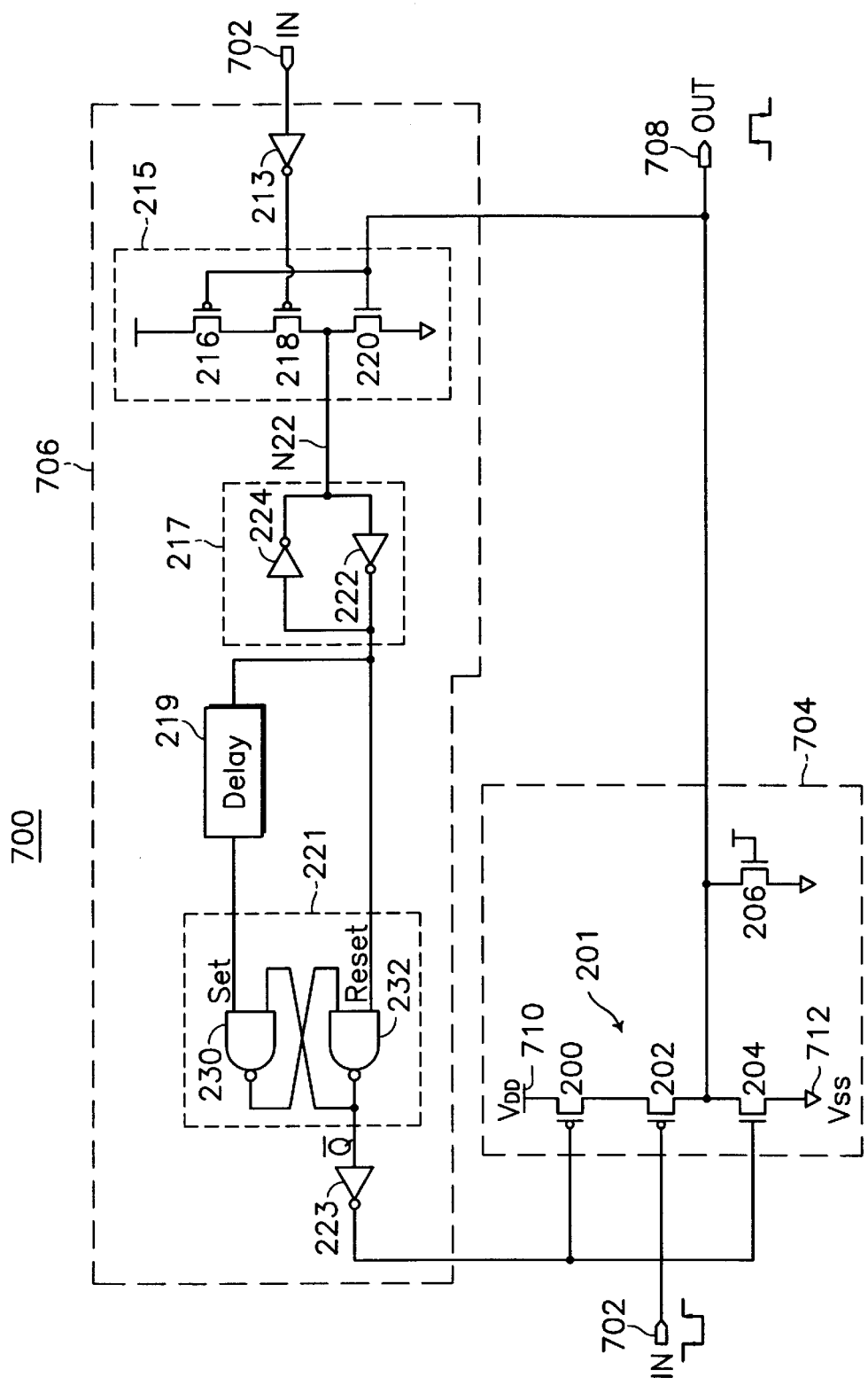
FIG. 7 is a schematic diagram illustrating a self-resetting logic circuit according to a fourth embodiment the present invention.

A self-resetting logic circuit 700 according to a fourth embodiment of the present invention is illustrated in FIG. 7. The self-resetting logic circuit 700 includes an input node 702 for receiving an input signal IN, an inverting buffer logic circuit 704, a reset circuit 706 for resetting the inverter logic circuit 704, and an output node 708.

The logic circuit 704 includes a dynamic inverter 201 including PMOS transistors 200, 202 and an NMOS transistor 204, and a smaller precharging NMOS transistor 206. The transistors 200, 202 and 204 have their conduction paths coupled in series between a first voltage bus 710, e.g., a bus having supply voltage $V_{DD}$, and a second voltage bus 712, e.g., a bus having a signal ground voltage $V_{SS}$. Gates of the transistors 200, 204 are coupled together. An input signal IN from the input node 702 is applied to gate of the transistor 202. The NMOS transistor 206 has its conduction path (channel) coupled between the first voltage bus 710 and a drain junction of transistors 202, 204 at the output node 708, and its gate coupled to the first voltage bus 710.

The reset circuit 706 includes two static CMOS inverters 213, 223, a dynamic inverter 215 including two PMOS transistors 216, 218 and an NMOS transistor 220, an inverting latch 217 including two cross-coupled static inverters 224, 222, an inverting delay circuit 219 formed by, for example, an odd number of serially-connected static inverters (not shown), and a bistable circuit, e.g., a S-R flip-flop 221 including two cross-coupled NAND logic gates 230, 232. Conduction paths of the transistors 216, 218, 220 are coupled in series between the first and second voltage busses 710, 712. Gates of the transistors 216, 220 are coupled to the output node 708. The input signal IN is applied through the inverter 213 to the gate of the transistor 218. One node of the inverting latch 217 is coupled to a drain junction node N22 of the transistors 218, 220, while the other node of the inverting latch 217 is coupled to the delay circuit 219 and a reset input Reset of the flip-flop 221. A set input Set of the flip-flop 221 is coupled to the delay circuit 219. An output $\overline{Q}$ of the flip-flop 221, i.e., the output of the NAND logic gate 232, is tied through inverter 223 to the gates of the transistors 200, 204.

The operation of the self-resetting logic circuit 700 will now be described. When the input signal IN remains at a logic high state, the PMOS transistor 202 is turned off and the output signal OUT at the output node 708 is held at a logic low state by operation of the NMOS transistor 206. With the output signal OUT in a low state, node N22 is held high as the PMOS transistors 216, 218 both conduct. This causes a high state and a low state, respectively, on the set input Set and the reset input Reset of the flip-flop 221. The output $\overline{Q}$ of the flip-flop 221 is thus at a logic high state, turning on the PMOS transistor 200 through the inverter 223. The logic circuit 700 is thus armed to respond to the next high-to-low transition of the input signal IN.

When the input signal IN transitions from a logic high state to a logic low state, the output node 708 is driven to a logic high state. The low-to-high transition of the output signal OUT triggers the reset circuit 706, causing the NMOS transistor 220 to conduct while the PMOS transistors 216, 218 are turned off, thus taking the node N22 low. This causes the reset input Reset of the flip-flop 221 to go high, but the output $\overline{Q}$ of the flip-flop 221 remains high until the set input Set of the flip-flow 221 goes low after the lapse of a predetermined delay time (e.g., 0.5 to 1.5 nsec) introduced by the inverting delay circuit 219. This causes the output $\overline{Q}$ of the flip-flop 221 to go low, so that the PMOS transistor 200 and the NMOS transistor 204 are turned off and on, respectively. This in turn causes the output signal OUT at the output node 708 to be pulled low. In this manner, the reset circuit 706 resets the logic circuit 704.

The high-to-low transition of the output signal OUT is fed back to the reset circuit 706, causing the PMOS transistor 216 to turn on and the NMOS transistor 220 to turn off. If at this time the input signal IN has already gone high, turning on the PMOS transistor 218, the node N22 goes high. This causes the reset input Reset of the flip-flop 221 to go low, resets the output $\overline{Q}$ to a high state and turns the PMOS and NMOS transistors 200, 204 on and off, respectively. The self-resetting logic circuit 700 is thus armed to respond to the next high-to-low transition of the input signal IN. If the input signal IN returns to a high state before the output signal OUT is reset by the flip-flop output $\overline{Q}$, the output signal OUT is driven low, causing the flip-flop output $\overline{Q}$ to be quickly reset to a high state. In the case that the input signal IN remains low throughout the pulse of the output signal OUT and remains high after the output signal OUT has transitioned back to a low state, the set and reset inputs Set, Reset of the flip-flop 221 are held constant until the input signal IN transitions to a high state. In response to the input signal IN transitioning back to a high logic state, the reset input Reset of the flip-flop 221 is quickly taken low, and the output $\overline{Q}$ of the flip-flop 221 is reset to a high state. Thus, it may be seen that the self-resetting logic circuit 700 may be quickly armed independent of the delay introduced by the delay circuit 219, with a delay that can be substantially less than the delay introduced by the delay circuit 219.

As described above, the low-to-high transition of the output signal OUT is transferred to the set input Set of the flip-flop 221 via delay circuit 219, thus producing a desired pulse width in the output signal OUT. However, the high state of the input signal IN can be directly fed back to the reset input Reset of the flip-flop 221 with considerably less delay in order to quickly prepare for the next operational cycle of the self-resetting logic circuit 700. This allows the self-resetting logic circuit 700 to be less vulnerable to process and/or environment variations that may affect the delay introduced by the delay circuit 221, resulting in more stable operation and reducing the likelihood of operational errors in high speed applications.

Figure 8:
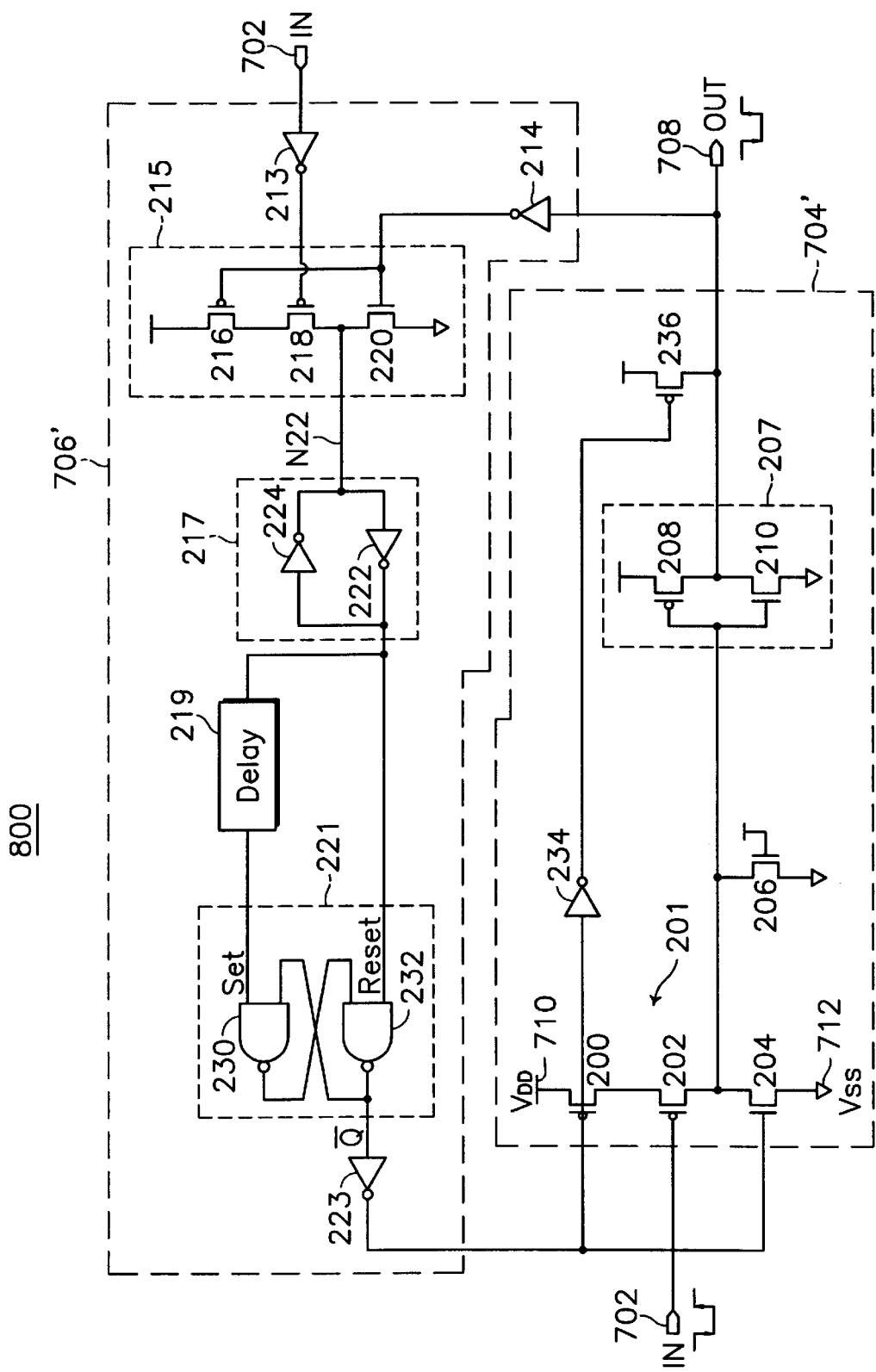
FIG.8 is a schematic diagram illustrating a self-resetting logic circuit according to a fifth embodiment the present invention.

FIG. 8 illustrates self-resetting logic circuit 800 according to a fifth embodiment of the present invention. The logic circuit 800 includes a non-inverting buffer logic circuit 704' having may of the same components as the inverting buffer logic circuit 704 of FIG. 7, as indicated by like reference numerals. However, the non-inverting buffer logic circuit 704' additionally includes two CMOS inverters 207, 234, and a PMOS transistor 236. The logic circuit 800 also includes a reset circuit 706' that includes many of the same components as the reset circuit 706 of FIG. 7, like reference numerals denoting like components, with the addition of a static inverter 214.

The self-resetting logic circuit 800 operates in a manner similar to the self-resetting logic circuit 700 of FIG. 7. When the input signal IN remains at a logic high state, the PMOS transistor 202 is turned off and the output signal OUT at the output node 708 is held at a logic high state. With the output signal OUT in a high state, node N22 is held high. This causes a high state and a low state, respectively, on the set input Set and the reset input Reset of the flip-flop 221. The output $\overline{Q}$ of the flip-flop 221 is thus at a logic high state, turning on the PMOS transistor 200 through the inverter 223. The logic circuit 800 is thus armed to respond to the next high-to-low transition of the input signal IN.

When the input signal IN transitions from a logic high state to a logic low state, the output node 708 goes low. The high-to-low transition of the output signal OUT triggers the reset circuit 706', causing the NMOS transistor 220 to conduct while the PMOS transistors 216, 218 are turned off, taking the node N22 low. This causes the reset input Reset of the flip-flop 221 to go high, but the output $\overline{Q}$ of the flip-flop 221 remains high until the set input Set of the flip-flow 221 goes low after the lapse of a predetermined delay time (e.g., 0.5 to 1.5 nsec) introduced by the inverting delay circuit 219. This causes the output $\overline{Q}$ of the flip-flop 221 to go low, so that PMOS transistor 200 and NMOS 204 transistor are rendered off and on, respectively. This in turn causes the output signal OUT at the output node 708 to return to a logic high state. In this manner, the output signal OUT is reset by the reset circuit 706'.

The low-to-high transition of the output signal OUT is fed back to the reset circuit 706', causing the PMOS transistor 216 to turn on and the NMOS transistor 220 to turn off. If at this time the input signal IN has already gone high, turning on the PMOS transistor 218, the node N22 goes high. This causes the reset input Reset of the flip-flop 221 to go low, resets the output $\overline{Q}$ to a high state and turns the PMOS and NMOS transistors 200, 204 on and off, respectively. The self-resetting logic circuit 700 is thus armed to respond to the next high-to-low transition of the input signal IN. If the input signal IN returns to a high state before the output signal OUT is reset by the flip-flop output $\overline{Q}$, the output signal OUT is driven high, causing the flip-flop output $\overline{Q}$ to quickly reset to a high state. In the case that the input signal IN remains low throughout the pulse of the output signal OUT and remains low after the output signal OUT has transitioned back to a high state, the set and reset inputs Set, Reset of the flip-flop 221 are held constant until the input signal IN transitions to a high state. In response to the input signal IN transitioning back to a high logic state, the reset input Reset of the flip-flop 221 is quickly taken low, and the output $\overline{Q}$ of the flip-flop 221 is reset to a high state. Thus, it may be seen that the self-resetting logic circuit 800 may be quickly armed independent of the delay introduced by the delay circuit 219, with a delay that can be substantially less than the delay introduced by the delay circuit 219.

As described above, the high-to-low transition of the output signal OUT is transferred to the set input Set of the flip-flop 221 via delay circuit 219, thus producing a desired pulse width in the output signal OUT. However, the high state of the input signal IN can be directly fed back to the reset input Reset of the flip-flop 221 with considerably less delay in order to quickly prepare for the next operational cycle of the self-resetting logic circuit 800. This allows the self-resetting logic circuit 800 to be less vulnerable to process and/or environment variations that may affect the delay introduced by the delay circuit 221, resulting in more stable operation and reducing the likelihood of operational errors in high speed applications.

Figure 9:
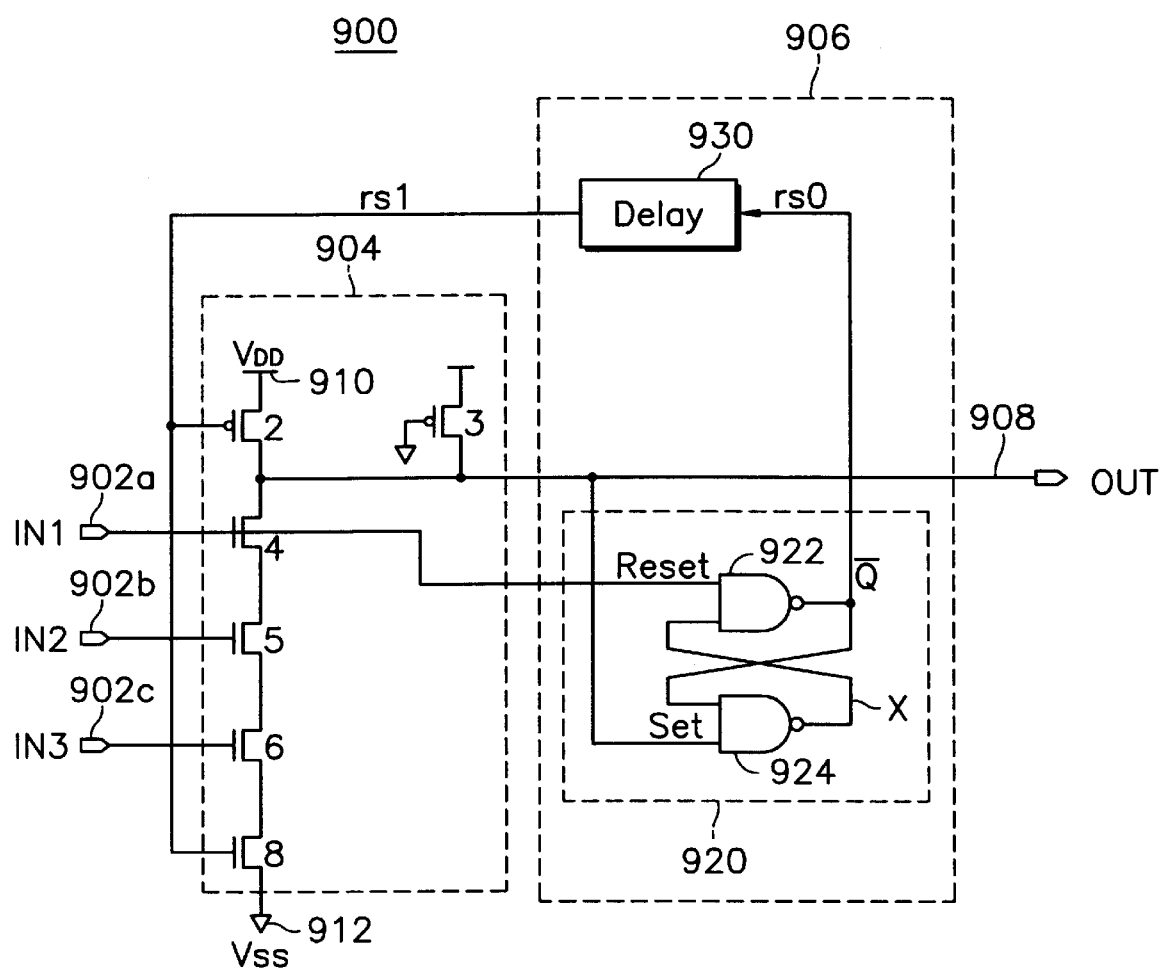
FIG. 9 is a schematic diagram illustrating a self-resetting logic circuit according to a sixth embodiment the present invention.

FIG. 9 illustrates a self-resetting logic circuit 900 according to a sixth embodiment of the present invention. The self-resetting logic circuit 900 includes input nodes 902a, 902b, 902c for receiving input signals IN1, IN2, IN3, respectively, a NAND logic circuit 904 for performing a logical NAND operation with respect to the input signals IN1, IN2, IN3 to produce an output signal OUT at an output node 908, and a reset circuit 906 for resetting the NAND logic circuit 904.

The NAND logic circuit 904 includes PMOS transistors 2, 3 and NMOS transistors 4, 5, 6, 8. Conduction paths (channels) of the transistors 2, 4, 5, 6, 8 are coupled in series between a first voltage bus (e.g., a supply voltage $V_{DD}$) 910 and a second voltage bus (e.g., a signal ground $V_{SS}$) 912. The input signals IN1, IN2, IN3 are applied to the gates of the NMOS transistors 4, 5, 6, respectively. The PMOS transistor 3, having a smaller size than the other transistors, has a conduction path coupled between the first voltage bus 910 and the output node 908, and a gate coupled to the second voltage bus 912.

The reset circuit 906 includes a bistable circuit, e.g., a S-R flip-flop 920 including two cross-coupled NAND gates 922, 924, and a delay circuit 930 including, for example, an even number of serially-connected inverters (not shown). The S-R flip-flop 920 has a set input Set coupled to the output node 908 and a reset input Reset coupled to the input node 902a. An input of the delay circuit 930 is coupled to an output $\overline{Q}$ of the flip-flop 920, and the output of the delay circuit 930 is coupled to the gates of the transistors 2, 8.

Figure 10:
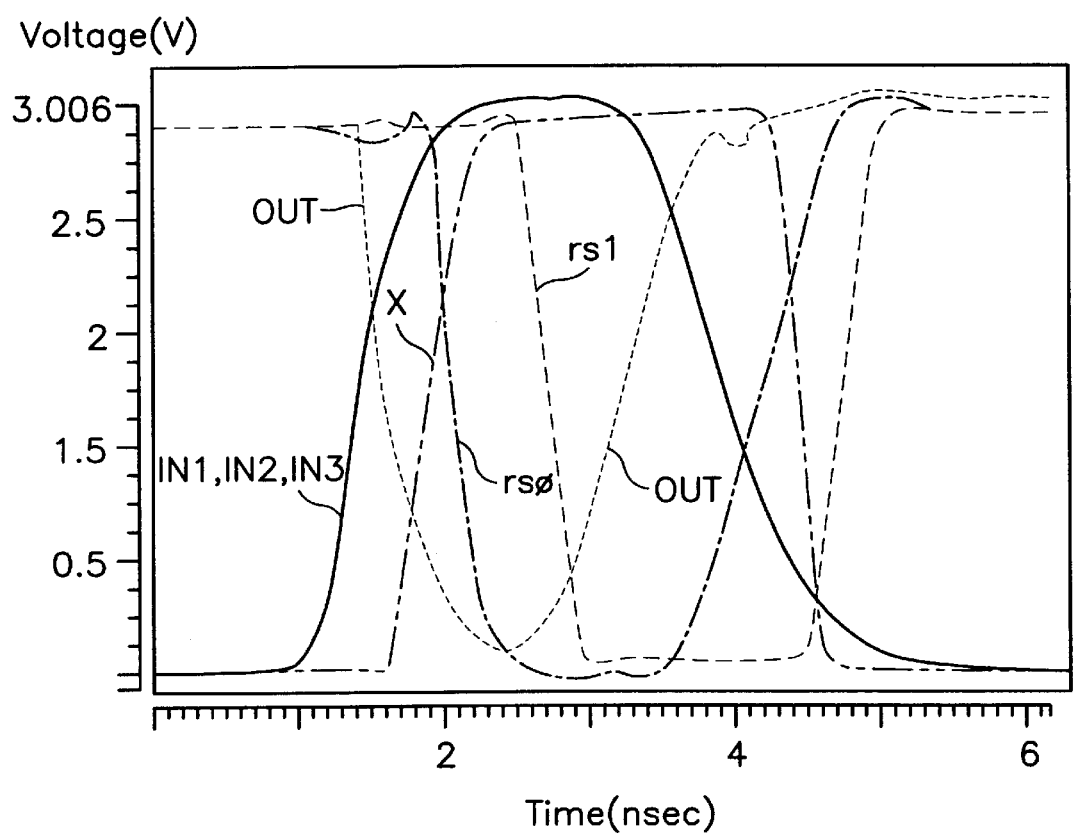
FIG. 10 is a timing diagram illustrating exemplary operations of the logic circuit of FIG. 9.

Exemplary operations of the self-resetting logic circuit 900 of FIG. 9 will now be described with reference to FIG. 10. When all of the input signals IN1, IN2, IN3 are low, the NMOS transistors 4, 5, 6 are turned off and output $\overline{Q}$ of the S-R flip-flop 920 is high. Delay circuit 930 introduces a predetermined delay time (e.g., about 1 nsec), producing a delayed reset signal rs1 having a high state. The PMOS transistor 2 and the NMOS transistor 8 are turned off and on, respectively, driving the output signal OUT at the output node 908 to a high state. The self-resetting dynamic NAND logic circuit 900 is thus armed to respond to a change of the input signals IN1, IN2, IN3.

When all the input signals IN1, IN2, IN3 become high, the output signal OUT at the output node 908 goes low, as the NMOS transistors 4, 5, 6, 8 are more conductive than the PMOS transistor 3. The low state of the output signal OUT triggers the reset circuit 906, causing the output $\overline{Q}$ (signal rsO) of the flip-flop 920 to go low. After a delay introduced by the delay circuit 930, the reset signal rs1 goes low and transistors 2, 8 are switched on and off, respectively. This causes the output signal OUT to quickly go to a high state, even though the input signals IN1, IN2, IN3 remain high. Adjusting the delay introduced by the delay circuit 930 can control the pulse width of the output signal OUT. When the input signal IN1 again goes low, the reset signals rsO, rs1 go high, rearming the self-resetting circuit 900 for the next time at which the input signals IN1, IN2, IN3 are again all high.

The self-resetting dynamic NAND logic circuit 900 of FIG. 9 can be utilized in decoder circuits of memory devices. If the transistors 5, 6 are bypassed, e.g., by pulling up the input nodes 902b, 902c or by short-circuiting between the junction of the transistors 4, 5 and the junction of the transistors 6, 8, the circuit 900 can function as a self-resetting inverter logic circuit with respect to the input signal IN1.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A self-resetting circuit, comprising:
   a logic circuit operative to transition an output signal from a first logic state to a second logic state responsive to a first logic state transition of an input signal; and
   a bistable reset circuit coupled to said logic circuit and operative to be triggered by said transition of said output signal from said first logic state to said second logic state to reset said output signal to said first logic state within a first predetermined interval following said transition of said output signal from said first logic state to said second logic state, and to be armed by a second logic state transition of said input signal next succeeding said first logic state transition, wherein said reset circuit is armed within a second predetermined interval following said second logic state transition that is less than said first predetermined interval.

2. A self-resetting circuit, comprising:
   a logic circuit operative to transition an output signal from a first logic state to a second logic state responsive to a first logic state transition of an input signal, wherein said logic circuit has an input node configured to receive said input signal, and a reset input node and an output node, and is operative to produce a transition in said output signal at said output node said responsive to said input signal when said reset input node is at a first one of said first and second logic states and to reset said output signal to said first logic state when said reset input is at a second one of said first and second logic states; and a bistable reset circuit coupled to said logic circuit and operative to be triggered by said transition of said output signal from said first logic state to said second logic state to reset said output signal to said first logic state within a first predetermined interval following said transition of said output signal from said first logic state to said second logic state, and to be armed by a second logic state transition of said input signal next succeeding said first logic state transition, wherein said reset circuit is armed within a second predetermined interval following said second logic state transition that is less than said first predetermined interval, wherein said bistable reset circuit has a first input node coupled to said output node of said logic circuit, a second input node coupled to said input node of said logic circuit, and an output node coupled to said reset input node of said logic circuit, and is operative to set said reset input node of said logic circuit to said first one of said first and second logic states responsive to said input signal and to set said reset input node of said logic circuit to said second one of said first and second logic states responsive to said output signal.

3. A circuit according to claim 2, wherein said reset circuit comprises a bistable circuit having a set input node coupled to said output node of said logic circuit, a reset input node coupled to said input node of said logic circuit, and an output node coupled to said reset input node of said logic circuit.

4. A circuit according to claim 3, wherein said bistable circuit comprises a set-reset (S-R) flip-flop.

5. A circuit according to claim 3, wherein said reset circuit comprises a delay circuit coupled between said set input node of said bistable circuit and said output node of said logic circuit, said delay circuit operative to produce a set signal at said set input node of said bistable circuit responsive to said transition of said output signal to said second logic state after a first delay to thereby set said reset input node of said logic circuit to said second one of said first and second logic states.

6. A circuit according to claim 5, wherein said reset circuit is operative to apply a reset signal at said reset input node of said bistable circuit responsive to said second logic state transition of said input signal after a second delay substantially less than said first delay to thereby reset said input node of said logic circuit to said first one of said first and second logic states.

7. A circuit according to claim 6, wherein said reset circuit is operative to reset said reset input node of said logic circuit to said first one of said first and second logic states responsive to said input signal when said output signal is at said first logic state.

8. A circuit according to claim 3, wherein said reset circuit comprises a delay circuit coupled between said output node of said bistable circuit and said reset input node of said logic circuit, said delay circuit operative to produce a state transition at said reset input node of said logic circuit after a predetermined delay following a state transition at said output node of said bistable circuit.

9. A circuit according to claim 8, wherein said bistable circuit is operative to reset said reset input node of said logic circuit to said first one of said first and second logic states after said predetermined delay following said second logic state transition of said input signal.

10. A self-resetting circuit, comprising:
a logic circuit having an output node, an input node and a reset input node and operative to transition an output signal at said output node from a first logic state to a second logic state responsive to a first logic state transition of an input signal at said input node when said reset input node is at a first one of a first logic state and a second logic state and to reset said output signal to said first logic state when said reset input is at a second one of said first and second logic states; and a reset circuit operatively associated with said logic circuit and including a bistable circuit having a set input node coupled to said output node of said logic circuit via a delay circuit, a reset input node coupled to said input node of said logic circuit, and an output node coupled to said reset input node of said logic circuit.

11. A circuit according to claim 10, wherein said bistable circuit operative to set said reset input node of said logic circuit to said second one of said first and second logic states within a first interval following a transition of said output signal to said second logic state, and to reset said reset input node to said first one of said first and second logic states within a second interval following a second logic state transition of said input signal that immediately succeeds said first logic state transition, said second interval less than said first interval.

12. A circuit according to claim 10, wherein said bistable circuit comprises a set-reset (S-R) flip-flop circuit.

13. A circuit according to claim 12, wherein said S-R flip-flop circuit comprises one of a pair of cross-coupled NAND gates or a pair of cross-coupled NOR gates.

14. A circuit according to claim 10, wherein said logic circuit comprises one of an inverting buffer or a non-inverting buffer.

15. A self-resetting circuit, comprising:
a logic circuit having an output node, an input node and a reset input node and operative to transition an output signal at said output node from a first logic state to a second logic state responsive to a first logic state transition of an input signal at said input node when said reset input node is at a first one of a first logic state and a second logic state and to reset said output signal to said first logic state when said reset input is at a second one of said first and second logic states; and a reset circuit operatively associated with said logic circuit and including a bistable circuit having a set input node coupled to said output node of said logic circuit, a reset input node coupled to said input node of said logic circuit, and an output node coupled to said reset input node of said logic circuit via a delay circuit.

16. A circuit according to claim 15, wherein said bistable circuit is operative to set said reset input node of said logic circuit to said second one of said first and second logic states within a first interval following a transition of said output signal to said second logic state, and to reset said output node of said logic circuit to said first logic state within a second interval following a second logic state transition of said input signal that immediately succeeds said first logic state transition, said second interval less than said first interval.

17. A circuit according to claim 15, wherein said bistable circuit comprises a set-reset (S-R) flip-flop circuit.

18. A circuit according to claim 16, wherein said S-R flip-flop circuit comprises a pair of cross-coupled NAND gates.

19. A method of operating a logic circuit, the method comprising the steps of:
transitioning an output signal of the logic circuit from a first logic state to a second logic state responsive to a first logic state transition of an input signal to the logic circuit;

triggering a reset circuit coupled to the logic circuit responsive to the transition of the output signal to from the first logic state to the second logic state to reset the output signal of the logic circuit to the first logic state within a first predetermined interval following the transition of the output signal from the first logic state to the second logic state; and arming the reset circuit responsive to a second logic state transition of said output signal next succeeding the first logic state transition within a second predetermined interval following the second logic state transition that is substantially less than the first predetermined interval.

20. A method according to claim 19, wherein the logic circuit has a reset input node, and further comprising the steps of:

transitioning said output signal from the first logic state to the second logic state responsive to the input signal when the reset input node is at a first one of the first and second logic states;

resetting the output signal to the first logic state when the reset input node is at a second one of the first and second logic states;

setting the reset input node of the logic circuit to the first one of the first and second logic states responsive to the input signal; and resetting the reset input node of the logic circuit to the second one of the first and second logic states responsive to the output signal.

* * * * *